United States Patent
Kitano et al.

(10) Patent No.: US 8,669,624 B2
(45) Date of Patent: Mar. 11, 2014

(54) SEMICONDUCTOR DEVICE AND MANUFACTURING METHOD THEREOF

(75) Inventors: Naomu Kitano, Machida (JP); Takashi Minami, Machida (JP); Nobuo Yamaguchi, Tama (JP); Takuya Seino, Kawasaki (JP); Takashi Nakagawa, Hachioji (JP); Heiji Watanabe, Mino (JP); Takayoshi Shimura, Ikeda (JP); Takuji Hosoi, Ibaraki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 13/558,746

(22) Filed: Jul. 26, 2012

(65) Prior Publication Data

US 2013/0285158 A1    Oct. 31, 2013

(30) Foreign Application Priority Data

Apr. 27, 2012  (JP) ................. 2012-102887

(51) Int. Cl.
  *H01L 21/70*  (2006.01)
  *H01L 21/02*  (2006.01)
  *H01L 29/78*  (2006.01)

(52) U.S. Cl.
  USPC ....... 257/407; 257/411; 257/412; 257/E29.16

(58) Field of Classification Search
  None
  See application file for complete search history.

(56) References Cited

U.S. PATENT DOCUMENTS

| | | | |
|---|---|---|---|
| 7,436,034 B2 | 10/2008 | Callegari et al. | |
| 7,750,418 B2 * | 7/2010 | Chudzik et al. | 257/407 |
| 7,776,701 B2 | 8/2010 | Callegari et al. | |
| 7,919,820 B2 | 4/2011 | Chung et al. | |
| 8,120,117 B2 * | 2/2012 | Tsuchiya | 257/369 |
| 8,513,740 B2 | 8/2013 | Park et al. | |
| 2006/0267113 A1 * | 11/2006 | Tobin et al. | 257/408 |
| 2008/0121999 A1 | 5/2008 | Kawahara et al. | |
| 2010/0109095 A1 * | 5/2010 | Li et al. | 257/392 |

(Continued)

FOREIGN PATENT DOCUMENTS

| | | |
|---|---|---|
| JP | 2007-173796 A | 7/2007 |
| JP | 2008-16538 A | 1/2008 |
| KR | 10-2008-0079940 A | 9/2008 |
| KR | 10-2011-0056120 A | 5/2011 |

OTHER PUBLICATIONS

Fillot et al. Investigations of titanium nitride as metal gate material, elaborated by metal organic atomic layer deposition using TDMAT and NH3. Aug. 2005. Microelectronic Engineering. vol. 82. pp. 248-253.*

(Continued)

*Primary Examiner* — Hoang-Quan Ho
(74) *Attorney, Agent, or Firm* — Fitzpatrick, Cella, Harper and Scinto (57) ABSTRACT

Provided are a semiconductor device which enables reduction of diffusion of Si in the manufacturing process of an MIPS element and suppression of an increase in EOT, and a method of manufacturing the same. An embodiment of the present invention is a semiconductor device including a field effect transistor having a gate insulating film provided on a silicon substrate and a gate electrode provided on the gate insulating film. The gate electrode is a stack-type electrode including a conductive layer containing at least Ti, N, and O (oxygen) and a silicon layer provided on the conductive layer, and the concentration of oxygen in the conductive layer is highest in the side of the silicon layer.

4 Claims, 9 Drawing Sheets

(56) References Cited

U.S. PATENT DOCUMENTS

| | | | |
|---|---|---|---|
| 2010/0127336 A1* | 5/2010 | Chambers et al. | 257/369 |
| 2012/0080756 A1* | 4/2012 | Suzuki et al. | 257/369 |
| 2012/0146113 A1* | 6/2012 | Suzuki et al. | 257/288 |
| 2012/0171855 A1* | 7/2012 | Ward et al. | 438/592 |
| 2012/0315749 A1* | 12/2012 | Hempel et al. | 438/591 |

OTHER PUBLICATIONS

Korean Office Action dated Sep. 3, 2013 in Korean Application No. 10-2012-0095713.

* cited by examiner

SEMICONDUCTOR DEVICE AND MANUFACTURING METHOD THEREOF

CROSS-REFERENCES TO RELATED APPLICATIONS

This application claims the benefit of Japanese Patent Application No. 2012-102887, filed Apr. 27, 2012. The contents of the aforementioned applications are incorporated herein by reference in their entirety.

BACKGROUND OF THE INVENTION

1. Field of the Invention

The present invention relates to a semiconductor device and a method of manufacturing the same, and more specifically, relates to a semiconductor device including a high permittivity gate dielectric film and a metal gate electrode (especially a metal oxide semiconductor field transistor (MOSFET)) and a method of manufacturing the same.

2. Description of the Related Art

In development of advanced complementary metal-oxide semiconductor (CMOS) devices with transistors increasingly miniaturized, there arise problems of degradation of driving current due to depletion of the poly-silicon (poly-Si) electrode and increase in gate current due to thinning of the gate dielectric film. Accordingly, consideration has been made on composite techniques to avoid the depletion of electrodes by applying metal gates and to reduce the gate leakage current by making the gate dielectric film of a high dielectric material to increase the physical thickness thereof. As the material of the metal gate electrode, pure metal, metallic nitride, silicide material, and the like are under consideration. However, in the case of any of such materials, threshold voltages (Vth) of N-type and P-type MOSFETs need to be settable to appropriate values. In the case of using a conventional gate electrode provided on a polycrystalline silicon film, the threshold voltage of the transistor is determined by the impurity concentration of the channel region and the impurity concentration of the polycrystalline silicon film. On the other hand, in the case of using a metal gate electrode, the threshold voltage of the transistor is determined by the impurity concentration of the channel region and the work function of the gate electrode. In order to manufacture a CMOS transistor having a Vth within +/−0.5 V, the gate electrode of the n-type MOSFET needs to be made of a material having a work function of not more than the midgap of Si (4.6 eV) and desirably not more than 4.4 eV. The gate electrode of the p-type MOSFET needs to be made of a material having a work function of not less than the midgap of Si (4.6 eV) and desirably not less than 4.8 eV.

As a means for implementing the aforementioned conditions, studies are currently made on a metal-inserted poly-silicon stack (MIPS) which is highly compatible with the existing CMOS manufacturing process. In this method, a gate electrode including a metal film between poly-Si and a gate insulating film is formed, and the threshold voltage is adjusted by the work function of the gate electrode. In this regard, the work function of the metal film changes depending on interaction between the metal film and the gate insulating film or poly-Si during a heat treatment process.

Japanese Patent Laid-open Publication No. 2008-16538 discloses a method of using a gate electrode including a stack of poly-crystalline silicon, PVD-TiN (a second metal layer), and CVD-TiN (a first metal layer). TiN film formed by conventional sputtering has a work function of only about 4.6 eV. However, in the description of Japanese Patent Laid-open Publication No. 2008-16538, the work function of TiN as the first metal layer directly formed on the gate insulating film can be not less than 4.8 eV, which is suitable for the metal gate of the p-type MOSFET, in such a way that TiN is formed by thermal CVD using $TiCl_4$ and $NH_3$ at a low temperature of not more than 450° C. Moreover, TiN as the second metal layer is formed by PVD at 500° C. (higher than the temperature at which TiN as the first metal layer is formed). The formed TiN is (100) oriented. According to Japanese Patent Laid-open Publication No. 2008-16538, this (100) oriented TiN has an effect in suppressing reduction of the work function due to diffusion of Si from Poly-Si into TiN in a thermal process (e.g. activation annealing) after the gate electrode is formed.

Japanese Patent Laid-open Publication No. 2007-173796 discloses a method of forming a metal oxynitride (TiON, for example) on a high dielectric constant film by sputtering. First, a metal (M) target and an atmosphere containing Ar, $N_2$, and oxygen are prepared. The metal target in the atmosphere is sputtered to form the metal oxynitride (TiON, for example). In Japanese Patent Laid-open Publication No. 2007-173796, the thus-formed stack of the high dielectric constant film and the metal oxynitride is used as the metal gate electrode. According to Japanese Patent Laid-open Publication No. 2007-173796, this method can produce TiN having a work function of not less than 4.8 eV, which is suitable for the metal gate of the p-type MPSFET.

However, the aforementioned techniques include the following issues.

The method described in Japanese Patent Laid-open Publication No. 2008-16538 is a technique effective in producing TiN having a high work function and suppressing reduction of the work function due to diffusion of Si from Poly-Si into TiN in a thermal process after the gate electrode is formed. However, TiN as the second metal layer, which is different from the first metal layer capable of reducing diffusion of Si, is separately formed by PVD after TiN as the first metal layer having a high work function is formed by CVD. Accordingly, the number of processes to manufacture the gate electrode is increased.

In the method described in Japanese Patent Laid-open Publication No. 2007-173796, the metal target is sputtered in the atmosphere containing Ar, $N_2$, and oxygen to form the metal oxynitride (TiON, for example) on the high dielectric constant film. Accordingly, oxygen exists uniformly in the metal oxynitride layer. After high temperature heat treatment for the stack of the high dielectric constant film and the metal oxynitride, oxygen diffuses from the metal oxynitride into the high dielectric constant film which is the underlying base for the metal oxynitride, thus increasing the EOT.

SUMMARY OF THE INVENTION

The present invention was made in the light of the aforementioned issues, and an objective of the present invention is to provide a semiconductor device in which diffusion of Si in the manufacturing process of a MIPS element can be reduced and an increase in EOT can be suppressed and to provide a method of manufacturing the same.

In order to achieve the aforementioned object, a first aspect of the present invention is a semiconductor device, including a field effect transistor having: a gate insulating film provided on a silicon substrate; and a gate electrode provided on the gate insulating film, in which the gate electrode is a stack-type gate electrode including: a conductive layer containing at least Ti, N, and O; and a silicon layer provided on the conductive layer. Moreover, the concentration of oxygen in the conductive layer is highest in the side of the silicon layer.

A second aspect of the present invention is a method of manufacturing a semiconductor device including a gate dielectric film provided on a silicon substrate and a gate electrode provided on the gate dielectric film, the method including: a first step of preparing the silicon substrate provided with the gate dielectric film thereon in a vacuum vessel; a second step of forming a first metal nitride layer containing Ti and N on the gate dielectric film; a third step of oxidizing a surface of the first metal nitride layer by introducing oxygen gas and performing heat treatment to form a conductive layer containing Ti, N, and O (oxygen); and a fourth step of forming a silicon layer on the conductive layer. In the third step, the conductive layer is formed so as to have the highest concentration of oxygen in the side of the silicon layer.

According to the present invention, it is possible to reduce Si diffused in the manufacturing process of MIPS elements and reduce the increase in EOT.

DESCRIPTION OF PREFERRED EMBODIMENTS

Hereinafter, a description is given of embodiments of the present invention in detail based on the drawings, but the present invention is not limited to the embodiments. In the drawings described below, parts having the same functions are given same reference numerals. Some of overlapping description thereof are omitted.

(First Embodiment)

An embodiment of the present invention is a semiconductor device including a field effect transistor having: a gate dielectric film provided on a silicon substrate; and a gate electrode provided on the gate dielectric film. The gate electrode is a stack-type gate electrode including: a conductive layer containing at least titanium (Ti), nitrogen (N), and oxygen (O); and a silicon layer provided on the conductive layer. The concentration of oxygen in the conductive layer is highest in the side of the silicon layer (at the interface between the silicon layer and conductive layer or in the vicinity thereof, for example). The inventor of the application newly found that the aforementioned configuration characteristic of the first embodiment could reduce the decrease in work function due to diffusion of Si (silicon) from the silicon layer into the conductive layer and reduce oxygen diffused from the conductive layer into the gate dielectric film (high permittivity dielectric film, for example) which is the base laid under the conductive layer to reduce the increase in EOT.

Another embodiment of the present invention is a method of manufacturing a semiconductor device including: a gate dielectric film provided on a silicon substrate; and a gate electrode provided on the gate insulating film. The method includes: a first step of preparing the silicon substrate provided with the gate insulating film thereon in a vacuum vessel (a step of feeding a silicon substrate provided with the gate dielectric film thereon into the vacuum vessel, for example); a second step of forming a metal nitride layer containing Ti and N on the gate insulating film; a third step of oxidizing the surface (exposed surface) of the metal nitride layer by introducing oxygen gas and performing heat treatment to form a conductive layer containing at least Ti, N, and O (oxygen); and a fourth step of forming a silicon layer on the conductive layer. The inventor of the application newly found that by forming the gate electrode with the method characteristic of this embodiment, the gate electrode could have a structure in which the oxygen concentration in the conductive layer is highest in the side of the silicon layer. Such a structure can reduce the decrease in work function due to diffusion of Si from the silicon layer into the conductive layer and reduce oxygen diffused from the conductive layer into the gate insulating film (high permittivity dielectric film, for example) which is the base laid under the conductive layer to reduce the increase in EOT.

Still another embodiment of the present invention is a method of manufacturing a semiconductor device including: a gate insulating film provided on a silicon substrate; and a gate electrode provided on the gate dielectric film. The method includes: a first step of preparing the silicon substrate provided with the gate insulating film thereon in a vacuum vessel (a step of feeding a silicon substrate provided with the gate dielectric film thereon into the vacuum vessel, for example); a second step of forming a metal nitride layer containing Ti and N, on the gate insulating film; a third step of oxidizing the surface of the metal nitride layer in an atmosphere of an oxygen partial pressure of 0.01 to 1 Pa by introducing oxygen gas and performing heat treatment to form a conductive layer containing at least Ti, N, and O (oxygen); and a fourth step of forming a silicon layer on the conductive layer. The inventor of the application newly found that by forming the gate electrode with the method characteristic of this embodiment, the gate electrode could have a structure in which the oxygen concentration in the conductive layer is the highest in the silicon layer side. Such a structure can reduce oxygen diffused from the conductive layer into the gate insulating film and reduce Si diffused from the silicon layer into the conductive layer, thus reducing the decrease in work function and the increase in EOT.

Figure 1:
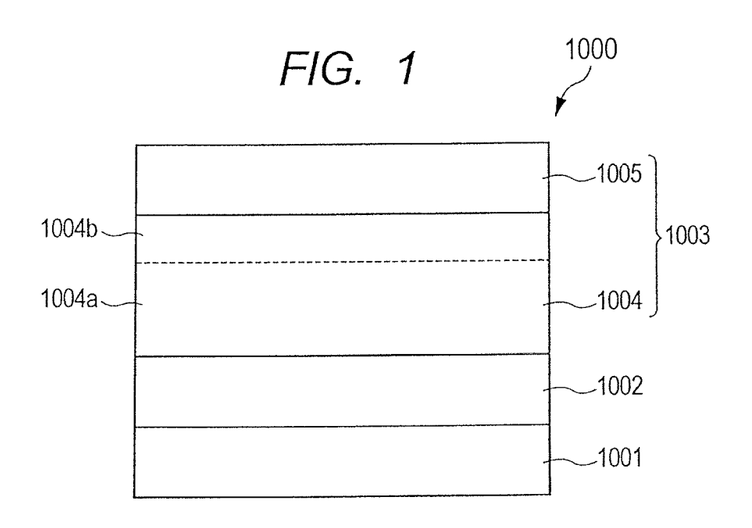
FIG. 1 is a cross-sectional view of a semiconductor device of a first embodiment of the present invention.

FIG. 1 is a cross-sectional view of a semiconductor device according to the first embodiment.

In FIG. 1, the semiconductor device 1000 includes a silicon substrate 1001; a gate dielectric film 1002 provided on the silicon substrate 1001; and a gate electrode 1003 provided on the gate dielectric film 1002. The gate electrode 1003 is a stack of a conductive layer 1004 containing at least Ti, N, and O and a silicon layer 1005. In this embodiment, the conductive layer 1004 is a metal nitride layer containing Ti and N before the silicon layer 1005 is formed. The conductive layer 1004 is formed by oxidizing the exposed surface (the surface of the metal nitride layer which is opposite to the surface facing the gate dielectric film 1002) before the silicon layer 1005 is formed. The conductive layer 1004 includes a metal nitride region 1004a and a metal oxynitride region 1004b. The metal oxynitride region 1004b is richer in oxygen than the metal nitride region 1004a and includes a region of the highest oxygen concentration in the conductive layer 1004. In such a manner, the metal oxynitride region 1004b is richer in oxygen than the metal nitride region 1004a and includes a plane constituting an interface of the conductive layer 1004 and silicon layer 1005. Accordingly, the oxygen concentration of the conductive layer 1004 is the highest in the silicon layer 1005 side (in other words, the region of the highest oxygen concentration is located on the silicon layer side).

It could be said that the conductive layer 1004, which is formed from the original metal nitride layer, has a configuration in which the oxygen concentration of the oxynitride layer is highest in the silicon layer 1005 side or has a configuration in which the oxygen concentration of the metal oxynitride layer is highest in the silicon layer 1005 side. Alternatively, it could be said that the conductive layer 1004 could not have any of the above configurations in the light of the specific composition. However, the important part of the present invention is not to specify the specific composition of the conductive layer 1004. The essence of the present invention is that the conductive layer 1004 provided between the silicon layer 1005 and gate insulating film 1002 contains at least Ti, N, and O and has the highest oxygen concentration in the silicon layer 1005 side. Accordingly, it is only necessary to obtain a structure which is characteristic of the present invention, and there is no point in specifying the specific composition of the conductive layer 1004 as described in the present invention.

The "metal nitride region 1004a" and "metal oxynitride region 1004b" are just names of convenience. The "metal nitride region 1004a" and "metal oxynitride region 1004b" are unnecessarily the metal nitride and metal oxynitride, respectively. In this specification, the "metal oxynitride region" is a region which contains at least Ti, N, and O and includes a region of the highest oxygen concentration in the conductive layer. Moreover, the "metal oxynitride region" is in contact with the silicon layer. As to the metal oxynitride region, its composition is a metal oxynitride in some cases but not in other cases. Moreover, the "metal nitride region" is a region which contains at least Ti and N and is part of the conductive layer other than the metal oxynitride region. As to the metal nitride region, its composition is a metal nitride in some cases but not in other cases, for example, in a case where oxygen is contained more than a predetermined amount.

Furthermore, in the present invention, there is no point in defining the metal nitride region 1004a and metal oxynitride region 1004b in the conductive layer 1004, in other words, in specifying which region is the metal nitride region and which region is the metal oxynitride region. The importance is that the region of the highest oxygen concentration in the conductive layer 1004 exists on the silicon layer 1005 side. Such a region is called the metal oxynitride region for convenience since the region is richer in oxygen than the metal nitride region.

Figure 2:
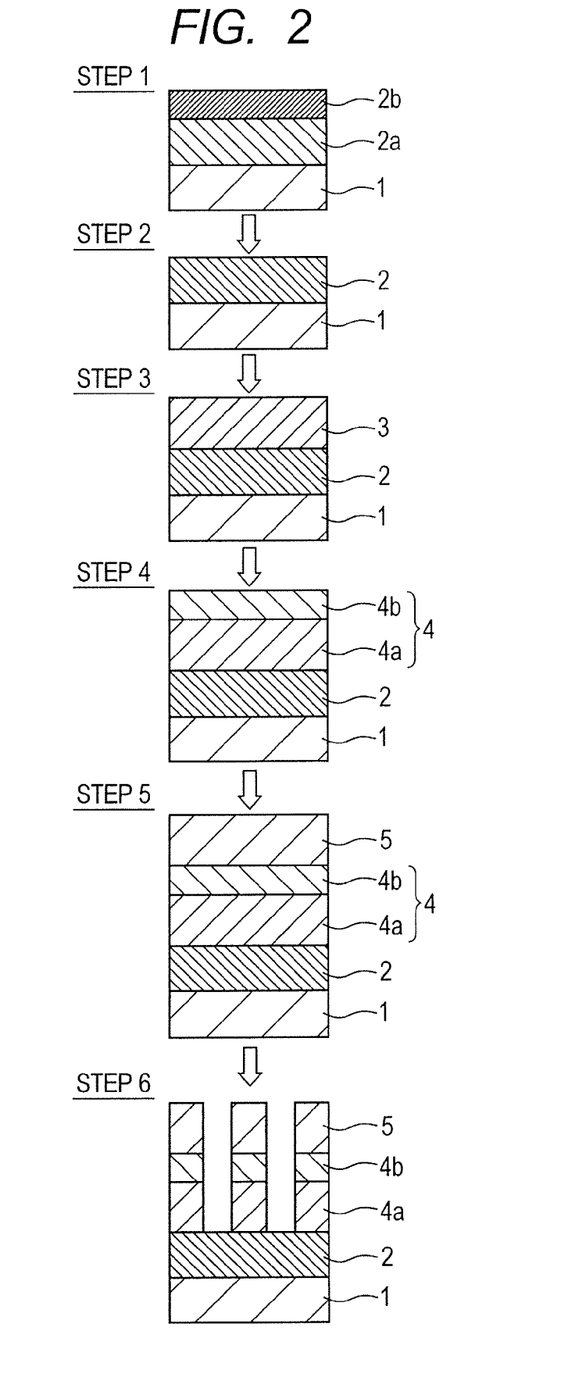
FIG. 2 is a view showing a manufacturing process of the semiconductor device of the first embodiment of the present invention.

FIG. 2 is a view showing a manufacturing process of the semiconductor device according to the first embodiment. As shown in FIG. 2, a nitride titanium film 3 is formed on a P-type silicon substrate 1 including a gate insulating film 2 including a silicon dioxide film and an HfSiO film as a high dielectric film. Subsequently, by oxidizing the surface of the titanium nitride film 3, the conductive layer 4 which includes the TiN region 4a as the metal nitride region and the TiON region 4b as the metal oxynitride region is formed. On the conductive layer 4, the silicon layer 5 is formed. The manufacturing process of the first embodiment is described using FIG. 2. The silicon substrate 1 initially includes thin SiO2 2a (for example, 1.8 nm thick) deposited by RTO, for example. In step 1 of FIG. 2, using an apparatus having the same configuration as the processing apparatus 100 described in FIG. 3 (herein, using a Hf target), a Hf film 2b (0.5 nm, for example) for forming a high permittivity gate dielectric film (HfSiO) is deposited on the SiO2 2a through magnetron sputtering.

Next, in step 2 of FIG. 2, after the Hf film 2a is deposited as described above, the silicon substrate 1 is conveyed into a not-shown heat annealing module. In the heat annealing module, the silicon substrate 1 with the $SiO_2$ 2a and Hf film 2b formed thereon is heated under oxygen gas atmosphere by SPIR to a high temperature of higher than 400° C. The Hf film 2b is thus oxidized to form the high permittivity gate dielectric film 2. This gate dielectric film 2 is a stack of $SiO_2$ formed on the silicon substrate 1 and HfSiO formed on the $SiO_2$ (HfSiO/$SiO_2$). Preferably, the oxygen gas has a partial pressure of oxygen of 0.01 to 1 Pa. If the oxygen partial pressure is not more than 0.01 Pa, leakage current is degraded. If the oxygen partial pressure is not less than 1 Pa, the EOT is increased. The heating process to form the stack can be performed by one step or plural steps. In order to control the chemical reaction during the annealing process, normally, it is proper to perform the heating process by two or more steps. For example, at first, the film is heated to 400° C. to oxidize the metal element within the Hf film. If the Hf film is heated at once to a very high temperature of 800° C., for example, the metal element within the film may form a silicon compound, which is stable and has metallic characteristics, in some cases. After the film is properly oxidized at a comparatively low temperature of 400° C., for example, the temperature is increased to a high temperature of 900° C., for example, preferably in an inert gas atmosphere. In the case where the starting material is a metal stack including different metals, high temperature annealing is important in diffusion between the materials and formation of uniform film.

Next, in step 3 of FIG. 2, the silicon substrate 1 with the high permittivity gate dielectric film 2 formed thereon is fed into the processing apparatus 100 including a Ti target 106. In the step 3, the silicon substrate 1 with the gate dielectric film 1 formed thereon is prepared in the processing apparatus 100 in such a manner. In the step 3, argon gas is introduced into the processing apparatus 100 from an inert gas source 201, and nitrogen gas is introduced into the processing apparatus 100 from a nitrogen gas source 205. By controlling the partial pressure ratio of argon gas to nitrogen gas, the titanium nitride film (TiN) 3 (10 nm thick, for example) is formed on HfSiO of the supplied high permittivity gate dielectric film 2 through magnetron sputtering. In the first embodiment, since the titanium nitride (TiN) 3 is formed by argon gas and nitrogen gas as described above, the titanium nitride film (TiN) 3 can be formed without using an element causing reduction action, such as $NH_3$. It is therefore possible to prevent formation of oxygen vacancies due to a reductant in the gate dielectric film. In the invention disclosed in Japanese Patent Laid-open Publication No. 2008-16538, the TiN film is formed by CVD using $NH_3$ as a raw material gas. This method includes a problem that oxygen vacancies are formed in the gate insulating film by the reduction action of $NH_3$ to cause variation in threshold voltage. On the other hand, according to the first embodiment, it is possible to prevent formation of oxygen vacancies due to a reductant in the gate dielectric film, thus preventing variation in threshold voltage.

Next, in step 4 of FIG. 2, oxygen gas is introduced from an oxygen gas source 209 into the processing apparatus 100 in which the silicon substrate 1 with the titanium nitride film (TiN) 3 formed thereon is placed, and the heat treatment (600 to 900° C.) is performed for the silicon substrate 1 by a heater 105. The surface of the titanium nitride film (TiN) 3 (the exposed surface of the titanium nitride film 3 including the surface opposite to the surface on which the gate insulating film 2 is formed) is therefore oxidized to form the conductive layer 4 including the TiON region 4b having the aforementioned surface and the TiN region 4a. In this embodiment, the oxidation process of the step 4 is performed within the processing apparatus 100 forming the titanium nitride film 3. However, the oxidation process may be performed in an oxidation process apparatus (an apparatus which can be supplied with oxygen gas and can heat the substrate) which is different from the processing apparatus 100.

Next, in step 5 of FIG. 2, the silicon target is magnetron sputtered under the inert gas condition within a vacuum vessel to form the silicon layer 5 on the TiON 4b. The vacuum vessel in the step 5 may be the aforementioned processing apparatus 100 or a PVD sputtering apparatus different from the processing apparatus 100. In the case where the step 5 is performed within the processing apparatus 100, a Si target (not shown) needs to be additionally provided within the processing apparatus 100. In this embodiment, the silicon layer 5 may be a poly-crystalline silicon layer.

In the first embodiment, it is preferable that the steps 3 to 5 of FIG. 2 are performed without exposing the silicon substrate 1 to the air.

Next, in step 6 of FIG. 2, thus obtained product is processed to form a MOSFET (metal oxide semiconductor field transistor) as a field electric transistor. Specifically, in the step 6, the structure obtained at the step 5 is subjected to PDA treatment (600 to 900° C., 30 s) and then subjected to dry etching for gate patterning. The structure is then subjected to FGA treatment (450° C., 30 min, 3%-$H_2/N_2$) to form the above-described MOSFET. In this embodiment, the aforementioned electric field transistor is a P-type MOSFET.

In this embodiment, for example, the high dielectric constant material used in the gate insulating film is a material with a relative permittivity higher than that of $SiO_2$ (3.9) and can be a metal oxide, a metal silicate, a metal oxide with nitrogen introduced, a metal silicate with nitrogen introduced, or the like. In terms of suppression of crystallization and an increase in reliability of devices, the high dielectric constant material is preferably a high dielectric constant material with nitrogen introduced. Metal contained in the high dielectric constant material is preferably Hf or Zr in the light of the heat resistance of the film and reduction in fixed charges in the film. Moreover, the high dielectric constant material is preferably a metal oxide containing Hf or Zr and Si and a metal oxynitride including such a metal oxide and nitrogen, and preferably HfSiO or HfSiON. In this embodiment, the gate insulating film 2 is a stack of the silicon oxide film and a high dielectric constant film stacked on the silicon oxide film, but is not limited to this. The gate insulating film 2 can be a single high dielectric constant film or a stack of a silicon oxynitride and a high dielectric constant film stacked on the same.

Figure 3:
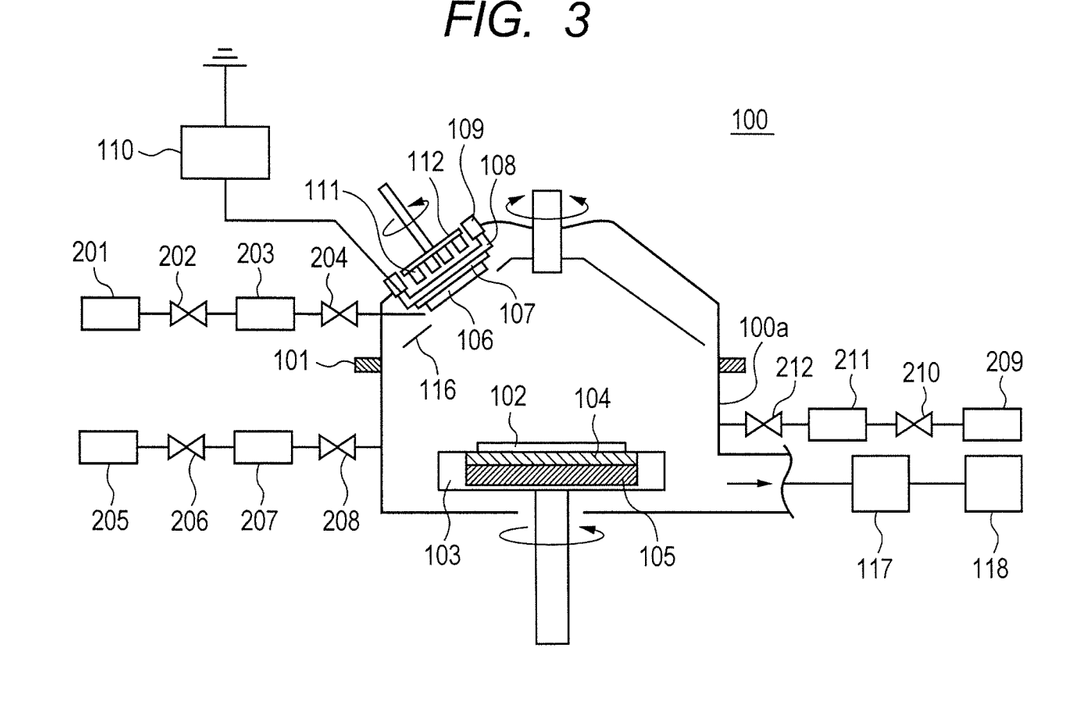
FIG. 3 is a schematic view of a processing apparatus used in a process to form a nitride titanium film in the first embodiment of the present invention.

FIG. 3 is a schematic view of the processing apparatus 100 used in the step of forming the titanium nitride film 3 and surface oxidation process for the titanium nitride film 3 in the first embodiment.

The processing apparatus 100 including a film forming chamber 100a is configured to be heated to a predetermined temperature by a heater 101. The processing apparatus 100 is configured to heat an object substrate 102 to a predetermined temperature by the heater 105 through a susceptor 104, which is incorporated in a substrate support table 103. The substrate support table 103 preferably rotates at a predetermined rotation rate in the light of the uniformity of film thickness. Within the film forming chamber 100a, the target 106 is positioned so as to face the target substrate 102. The target 106 is installed in a target holder 108 with a back plate 107 interposed therebetween. The back plate 107 is made of metal such as Cu. As the target, the target 106 and back plate 107 may be combined into a target assembly as a single part whose exterior is made of the target material. In other words, the target may be configured to be set in the target holder. The target holder 108 made of metal, such as Cu, is connected to a DC power supply 110 applying electric power for sputtering discharge and is isolated by an insulator 109 from the wall of the film forming chamber 100a having a ground potential. On the opposite side of the target 106 from the sputter surface, a magnet 111 for magnetron sputtering is provided. The magnet 111 is held by a magnet holder 112 and can be rotated by a not-shown magnet holder rotating mechanism. The magnet 111 rotates during discharge in order to equalize erosion of the target 106. The target 106 is placed at an offset position diagonally above the substrate 102. In other words, the center point of the sputter surface of the target 106 is deviated from the normal line of the center of the substrate 102 by a predetermined distance. Between the target 106 and target substrate 102, a shield plate 116 is placed. The shield plate 116 is configured to control film formation on the target substrate 102 by sputtering particles emitted from the target 106 supplied with electric power.

In this embodiment, the target 106 is a metal target of Ti. Deposition of the titanium nitride film is carried out by supplying electric power to the metal target 106 from the DC power supply 110 through the target holder 108 and back plate 107. At this time, argon gas as inert gas is introduced from an inert gas source 201 through a valve 202, a mass flow controller 203, and a valve 204 into the film forming chamber 100a near the target. The reactive gas containing nitrogen is introduced from a nitrogen gas source 205 through a valve 206, a mass flow controller 207, and a valve 208 to the vicinity of the substrate in the film forming chamber 100a. The introduced inert gas and reactive gas are discharged through a conductance valve 117 by an exhaust pump 118. During the surface oxidation for the titanium nitride film, oxygen gas is introduced from an oxygen gas source 209 through a valve 210, a mass flow controller 211, and a valve 212 into the film forming chamber 100a.

Hereinafter, the semiconductor device according to the first embodiment and the method of manufacturing the same are described in detail based on examples. However, the present invention is not limited to the following examples and can be variously changed without departing from the scope of the present invention.

EXAMPLES

Deposition of the titanium nitride film 3 in this example was carried out in the processing apparatus 100 using argon as the sputtering gas and nitrogen as the reactive gas. The substrate temperature was properly determined in a range of 27 to 600° C.; the target power, 50 to 1000 W; the sputtering gas pressure, 0.01 to 1.0 Pa; the flow rate of Ar, 0 to 200 sccm; and the flow rate of nitrogen, 0 to 100 sccm. In this embodiment, the titanium nitride film 3 was deposited with the substrate temperature set to 30° C. and the target power of the Ti target 106 set to 750 W. At this time, the flow rate of argon gas was varied in a range of 0 to 20 sccm, and the flow rate of nitrogen gas was varied in a range of 2 to 50 sccm (the step 3 of FIG. 2).

Next, in the processing apparatus 100, the deposited titanium nitride film 3 was subjected to heat treatment in the oxygen gas to form the TiON region 4b in a region including the surface of the conductive layer 4 (the surface of the titanium nitride film 3 in the original material) (the step 4 of FIG. 2). At forming the TiON film 4b, it is preferable that the metal oxynitride region (TiON region) is formed so that the content of oxygen is $2\times10^{15}$ to $7\times10^{15}$ atoms/cm$^2$ in a surface of the TiON region 4b constituting the interface between the TiON region 4b and the silicon layer 5 by introducing oxygen gas into the film forming chamber 100a while performing heat treatment for the titanium nitride film 3 as the metal nitride layer. If the content of oxygen is not more than $2\times10^{15}$ atoms/cm$^2$, the effective work function (eWF) is degraded, and if the content of oxygen is not less than $7\times10^{15}$ atoms/cm$^2$, the EOT is increased.

Next, the silicon layer 5 was deposited to 20 nm on the formed TiON region 4b by sputtering (the step 5 of FIG. 2). Next, the manufactured sample was subjected to annealing (high temperature heat treatment) for 30 seconds at 600 to 900° C. in the nitrogen gas ambience. Next, using lithography and RIE (reactive ion etching) techniques, the stack of the conductive layer 4 and silicon layer 5 was processed into a desired size, thus forming devices each including an MIPS type gate electrode (the step 6 of FIG. 2).

The devices manufactured according to the first embodiment were evaluated in terms of electrical characteristics including the effective work function (eWF), EOT, leakage current characteristics based on C-V and I-V measurements. In this specification, the eWF can be generally calculated from the flat band voltage obtained by the CV measurement of the gate dielectric film and gate electrode. The eWF is affected by fixed charges in the dielectric film, electric dipoles formed in the interface, Fermi level pinning, and the like in addition to the true work function of the gate electrode. The eWF is distinguished from the true work function of the material constituting the gate electrode.

Hereinafter, a description is given of the effect by forming in the region in contact with the silicon layer 5 of the conductive layer 4, the TiON region 4b as the metal oxynitride region containing oxygen and an element constituting the titanium nitride film 3 as the original metal nitride.

Figure 4:
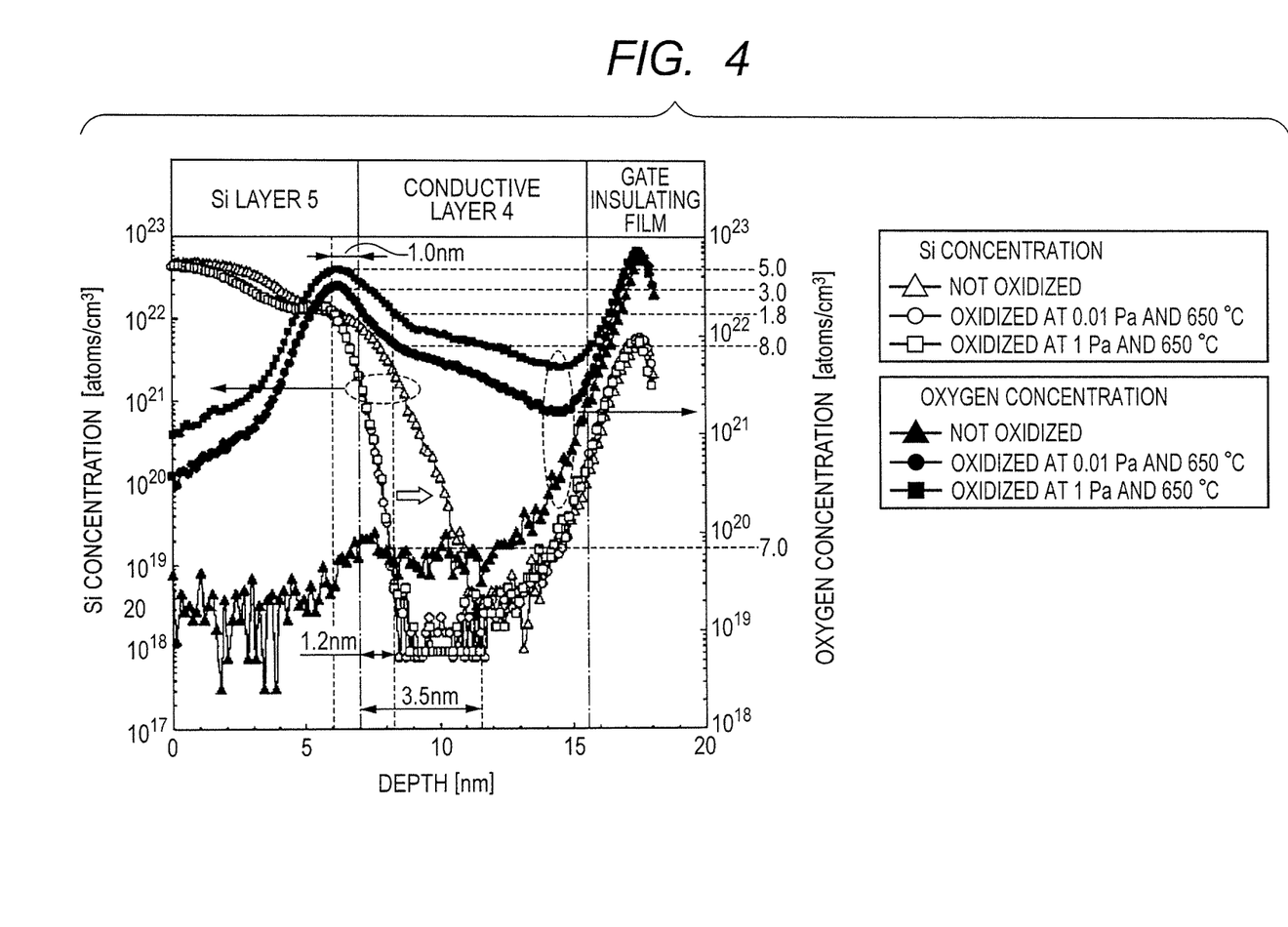
FIG. 4 is a diagram showing a result of SIMS (secondary ion mass spectrometry) analysis performed for devices manufactured by the manufacturing method of the first embodiment of the present invention, from the silicon substrate surface side.

FIG. 4 shows results of SIMS (secondary ion mass spectrometry) performed for the devices manufactured by the manufacturing method according to the embodiment from the silicon substrate surface side. The depth shown in FIG. 4 is calculated from time taken to etch the TiN film by argon. FIG. 4 shows that, because of the step of forming the TiON region as the metal oxynitride region containing oxygen, the concentration of oxygen of the conductive layer 4 varied in the thickness direction (in a direction from the gate insulating film 2 toward the silicon layer 5). Furthermore, it is revealed that the position of the highest oxygen concentration in the thickness direction existed on the silicon layer 5 side of the conductive layer 4. Furthermore, FIG. 4 shows that the silicon concentration in the conductive layer 4 near the interface between the silicon layer 5 and conductive layer 4 was lower when the step of forming the metal oxynitride region was performed than when not performed. Accordingly, by forming the TiON region 4b as the metal oxynitride region, it is possible to reduce silicon diffused from the overlying silicon layer 5 into the conductive layer 4 under the silicon layer 5. In the present invention, therefore, the metal oxynitride region functions as a barrier layer against silicon from the silicon layer which is formed in contact with the metal oxynitride region.

In FIG. 4, symbols ▲ indicate the oxygen concentration of a comparative example in which metal nitride (TiN, for example) was formed on a high permittivity gate dielectric film (HfSiO, for example) without the oxidation treatment characteristic of the present invention. Symbols ● indicate the oxygen concentration in a case where the titanium nitride film (TiN) 3 (10 nm, for example) was formed on the high permittivity gate dielectric film 2 (HfSiO, for example) with magnetron sputtering and the surface of the titanium nitride (TiN) film 3 was oxidized by supplying oxygen gas (0.01 Pa) to the titanium nitride (TiN) film 3 and performing heat treatment (650° C., for example) to form the TiON region 4b (in the case of forming the conductive layer 4 according to the first embodiment). Symbols ■ indicate the oxygen concentration in a case where the titanium nitride (TiN) film 3 (10 nm, for example) was formed on the high permittivity gate dielectric film 2 (HfSiO, for example) with magnetron sputtering and the surface of the titanium nitride (TiN) film 3 was oxidized by supplying oxygen gas (1 Pa) to the titanium nitride (TiN) film 3 and performing heat treatment (650° C., for example) to form the TiON region 4b (in the case of forming the conductive layer 4 according to the embodiment).

In FIG. 4, symbols A indicate the Si concentration of a comparative example in which metal nitride (TiN, for example) was formed on a high dielectric constant gate insulating film (HfSiO, for example) without performing the oxidation treatment characteristic of the present invention. Symbols ○ indicate the Si concentration in a case where the titanium nitride film (TiN) 3 (10 nm, for example) was formed on the high permittivity gate dielectric film 2 (HfSiO, for example) with magnetron sputtering and the surface of the titanium nitride (TiN) film 3 was oxidized by supplying oxygen gas (0.01 Pa) to the titanium nitride (TiN) film 3 and performing heat treatment (650° C., for example) to form the TiON region 4b (in the case of forming the conductive layer 4 according to the first embodiment). Symbols □ indicate the Si concentration in a case where the titanium nitride (TiN) film, 3 (10 nm, for example) was formed on the high permittivity gate dielectric film 2 (HfSiO, for example) with magnetron sputtering and the surface of the titanium nitride (TiN) film 3 was oxidized by supplying oxygen gas (1 Pa) to the titanium nitride (TiN) film 3 and performing heat treatment (650° C., for example) to form the TiON region 4b (in the case of forming the conductive layer 4 according to the embodiment).

The vicinity of the interface between the silicon layer 5 and conductive layer 4 (TiON region 4b) is defined as a region within 15% of the film thickness of the conductive layer 4 from the interface. For example, if the film thickness of the conductive layer 4 is 10 nm, the vicinity of the interface is a region within 1.5 nm from the interface between the silicon layer 4 toward the inside of the conductive layer 4. Also in the comparative examples, the vicinity of the interface between the silicon layer and titanium nitride layer is defined as a region within 15% of the film thickness of the titanium nitride layer from the interface.

As shown in FIG. 4, as for the oxygen concentration of the examples indicated by the symbols ● and ■, in a range of 1.2 nm, which was 12% of the film thickness (10 nm) of the conductive layer 4, from the silicon layer 5, the oxygen concentration continuously decreased between $8.0 \times 10^{21}$ and $5.0 \times 10^{22}$ atoms/cm$^3$ from the silicon layer 5 toward the inside of the conductive layer 4. This shows that, in this embodiment, the oxygen concentration was highest in the vicinity of the interface between the silicon layer 5 and conductive layer 4. In other words, the position (region) in the conductive layer 4 where the oxygen concentration is the highest in the thickness direction existed on the silicon layer 5 side. By contrast, as shown in FIG. 4, in the case of the symbols ▲ of the comparative example, the oxygen concentration was evenly about $7.0 \times 10^{19}$ atoms/cm$^3$ in a range of 3.5 nm, which was 35% of the thickness (10 nm) of the titanium nitride layer from the silicon layer. This shows that the oxygen concentration of the titanium nitride layer was not highest in the vicinity of the interface between the silicon layer and titanium nitride layer.

On the other hand, as for the Si concentration of the examples indicated by the symbols ○ and □, the position where the Si concentration decreased to $2.0 \times 10^{18}$ atoms/cm$^3$ or less existed at a depth of 1.2 nm or more (12% of the film thickness (10 nm) of the conductive layer 4) from the silicon layer 5. By contrast, as shown in FIG. 4, in the case of the symbols A of the comparative example, the Si concentration decreased to the $2.0 \times 10^{18}$ atoms/cm$^3$ or less at a depth of 3.5 nm (35% of the thickness (10 nm) of the titanium nitride layer) from the silicon layer. This reveals that, in this embodiment, the existence of the region of the highest oxygen concentration at the interface between the conductive layer 4 and silicon layer 5 was correlated with reduction of diffusion of silicon from the silicon layer 5 into the conductive layer 4 and silicon diffused from the silicon layer is reduced. In other words, by locating the region of the highest oxygen concentration in the conductive layer 4 at the interface between the conductive layer 4 and silicon layer 5 or in the vicinity thereof, the TiON region (metal oxynitride region) 4b including the region of the highest oxygen concentration functions as a barrier layer against diffusion of silicon from the silicon layer into the conductive layer 4, so that silicon diffused from the silicon layer can be reduced. This can also reduce the decrease in work function due to the diffusion of silicon.

Figure 5:
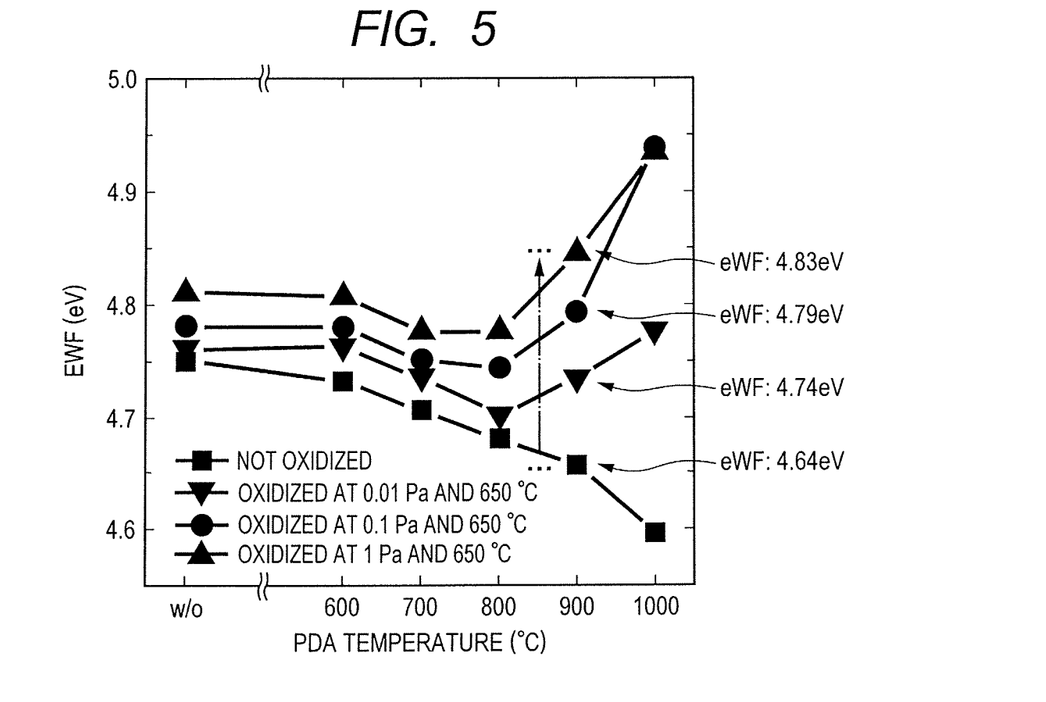
FIG. 5 is a diagram showing a relationship between eWF of devices manufactured by the manufacturing method of the first embodiment of the present invention and heat treatment temperature after the gate electrodes thereof are formed.

FIG. 5 is a diagram showing a relationship between the effective work function eWF of devices manufactured by the manufacturing method of the first embodiment and the heat treatment temperature after the gate electrode was formed. FIG. 5 also shows, as a comparative example, the characteristic of a device obtained without performing the step of forming the metal oxynitride region in the region where the titanium nitride layer and silicon layer are in contact. As shown in FIG. 5, by performing the step of forming the metal oxynitride region, the decrease in eWF due to the heat treatment can be reduced. In FIG. 5, symbols ■ indicate, as a comparative example, the case where metal nitride (TiN, for example) was formed on a high dielectric gate insulating film (HfSiO, for example) without the oxidation treatment characteristic of the present invention. Symbols ▼ indicate the case where the titanium nitride film (TiN) 3 (10 nm, for example) was formed on the high dielectric constant gate insulating film 2 (HfSiO, for example) with magnetron sputtering and the surface of the titanium nitride (TiN) film 3 was oxidized by supplying oxygen gas (0.01 Pa) to the titanium nitride (TiN) film 3 and performing heat treatment (650° C., for example) to form the TiON region 4b. Symbols ● indicate the case where the titanium nitride (TiN) film 3 (10 nm, for example) was formed on the high dielectric constant gate insulating film 2 (HfSiO, for example) with magnetron sputtering and the surface of the titanium nitride (TiN) film 3 was oxidized by supplying oxygen gas (0.1 Pa) to the titanium nitride (TiN) film 3 and performing heat treatment (650° C., for example) to form the TiON region 4b. Symbols ▲ indicate the case where the titanium nitride (TiN) film 3 (10 nm, for example) was formed on the high dielectric constant gate insulating film 2 (HfSiO, for example) with magnetron sputtering and the surface of the titanium nitride (TiN) film 3 was oxidized by supplying oxygen gas (1 Pa) to the titanium nitride (TiN) film 3 and performing heat treatment (650° C., for example) to form the TiON region 4. In the cases of the symbols ▼, ●, and ▲, it was revealed that the effective work function eWF was not less than 4.75 eV regardless of the heat treatment temperature after the gate electrode was formed. By contrast, in the cases of the symbols ■ in FIG. 5, it was found that the effective work function eWF decreased as the heat treatment temperature after formation of the gate electrode increased and reached to 4.65 eV or less.

Figure 6:
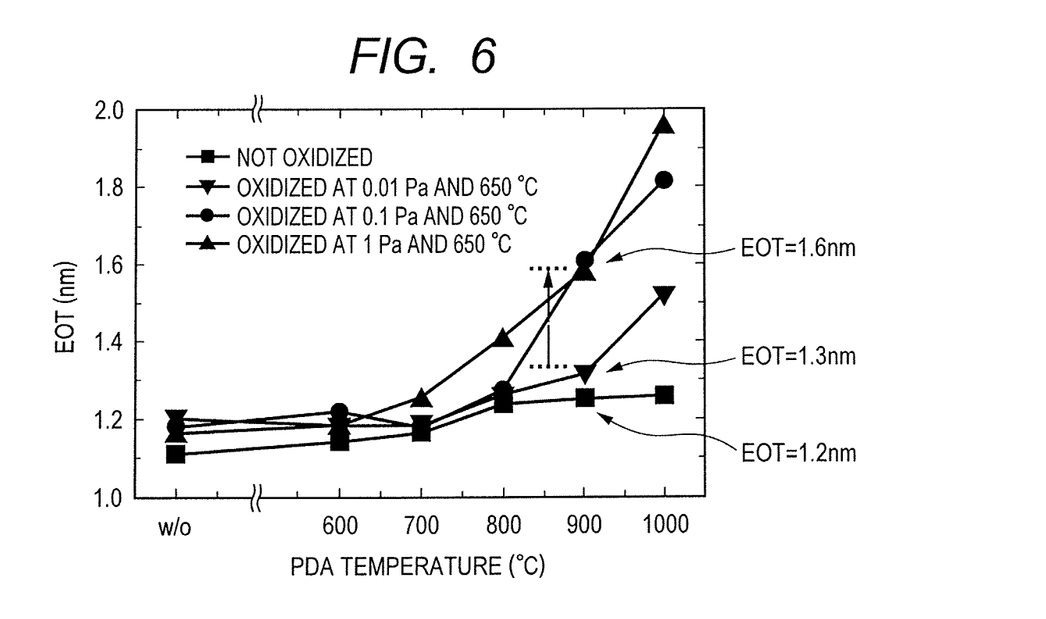
FIG. 6 is a diagram showing a relationship between EOT of devices manufactured by the manufacturing method of the first embodiment of the present invention and heat treatment temperature after the gate electrodes thereof are formed.

FIG. 6 is a diagram showing a relationship between the EOT of devices manufactured by the manufacturing method according to the first embodiment and the heat treatment temperature after formation of the gate electrode. FIG. 6 also shows, as a comparative example, the characteristics of a device obtained without the step of forming a metal oxynitride region in the region where the titanium nitride layer and silicon layer are in contact. As shown in FIG. 6, by controlling the process conditions of the step of forming the metal oxynitride region which are characteristics of the present invention, the increase in EOT due to the heat treatment can be reduced. In other words, it is possible to reduce diffusion of oxygen from the conductive layer 4 into the gate insulating film 2 which is the base laid under the conductive layer 4.

In FIG. 6, symbols ■ indicate the case where metal nitride (TiN, for example) was formed on a high dielectric constant gate insulating film (HfSiO, for example) without the oxidation treatment characteristic of the present invention. Symbols ▼ indicate the case where the titanium nitride film (TiN) 3 (10 nm, for example) was formed on the high dielectric constant gate insulating film 2 (HfSiO, for example) with magnetron sputtering and the surface of the titanium nitride (TiN) film 3 was oxidized by supplying oxygen gas (0.01 Pa) to the titanium nitride (TiN) film 3 and performing heat treatment (650° C., for example) to form the TiON region 4b. Symbols ● indicate the case where the titanium nitride (TiN) film 3 (10 nm, for example) was formed on the high dielectric constant gate insulating film 2 (HfSiO, for example) with magnetron sputtering and the surface of the titanium nitride (TiN) film 3 was oxidized by supplying oxygen gas (0.1 Pa) to the titanium nitride (TiN) film 3 and performing heat treatment (650° C., for example) to form the TiON region 4b. Symbols ▲ indicate the case where the titanium nitride (TiN) film 3 (10 nm, for example) was formed on the high dielectric constant gate insulating film 2 (HfSiO, for example) with magnetron sputtering and the surface of the titanium nitride (TiN) film 3 was oxidized by supplying oxygen gas (1.0 Pa) to the titanium nitride (TiN) film 3 and performing heat treatment (650° C., for example) to form the TiN region 4b. In the cases of the symbols ■ and ▲, it was found that the EOT increased as the heat treatment temperature after formation of the gate electrode increased.

Figure 7:
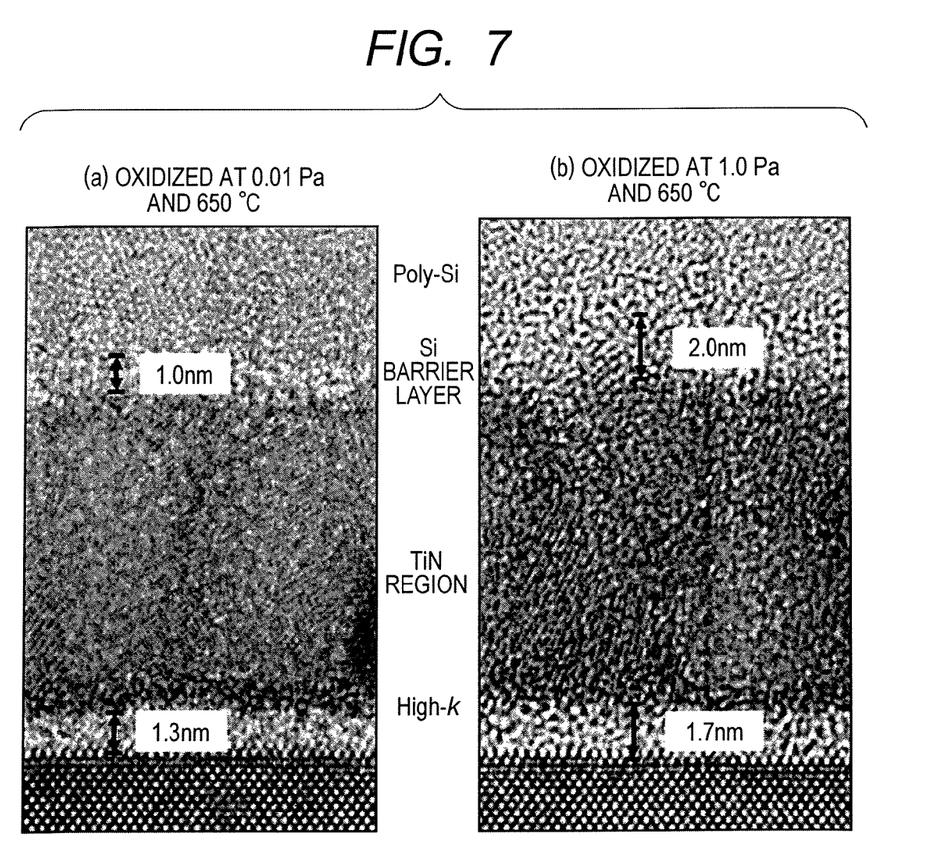
FIG. 7 is a view showing TEM images of cross sections of devices manufactured by the manufacturing method of the first embodiment of the present invention.

FIG. 7 is a view of cross sections of devices manufactured by the manufacturing method of the first embodiment, which were observed by a TEM after heat treatment at 900° C. for 30 seconds. This shows that an oxidized layer (corresponding to the metal oxynitride region) as a barrier layer against the diffusion of silicon from the upper Si into Tin was formed between TiN and the overlying Si by performing the oxidation treatment for TiN as one of the characteristics of the present invention. Moreover, it was revealed that by increasing the oxygen partial pressure, the thickness of the aforementioned oxidized layer was increased while the thickness of the underlying $SiO_2$ was increased. Specifically, the surface of the metal nitride layer was oxidized by introduced oxygen gas and heat treatment in the atmosphere with an oxygen partial pressure of 0.01 to 1 Pa before formation of the overlying silicon layer to form the metal oxynitride region containing at least Ti, N, and O (oxygen), and thereby a structure in which the oxygen concentration of the conductive layer was highest on the silicon layer side can be obtained. It was revealed that the thus-obtained structure can reduce diffusion of oxygen after the high temperature heat treatment from the conductive layer including the metal nitride region and metal oxynitride region into the underlying interface layer (gate insulating film) and reduce Si diffused from the overlying silicon layer into the conductive layer lying under the silicon layer, and it is therefore possible to reduce the reduction in work function and the increase in EOT.

Figure 8:
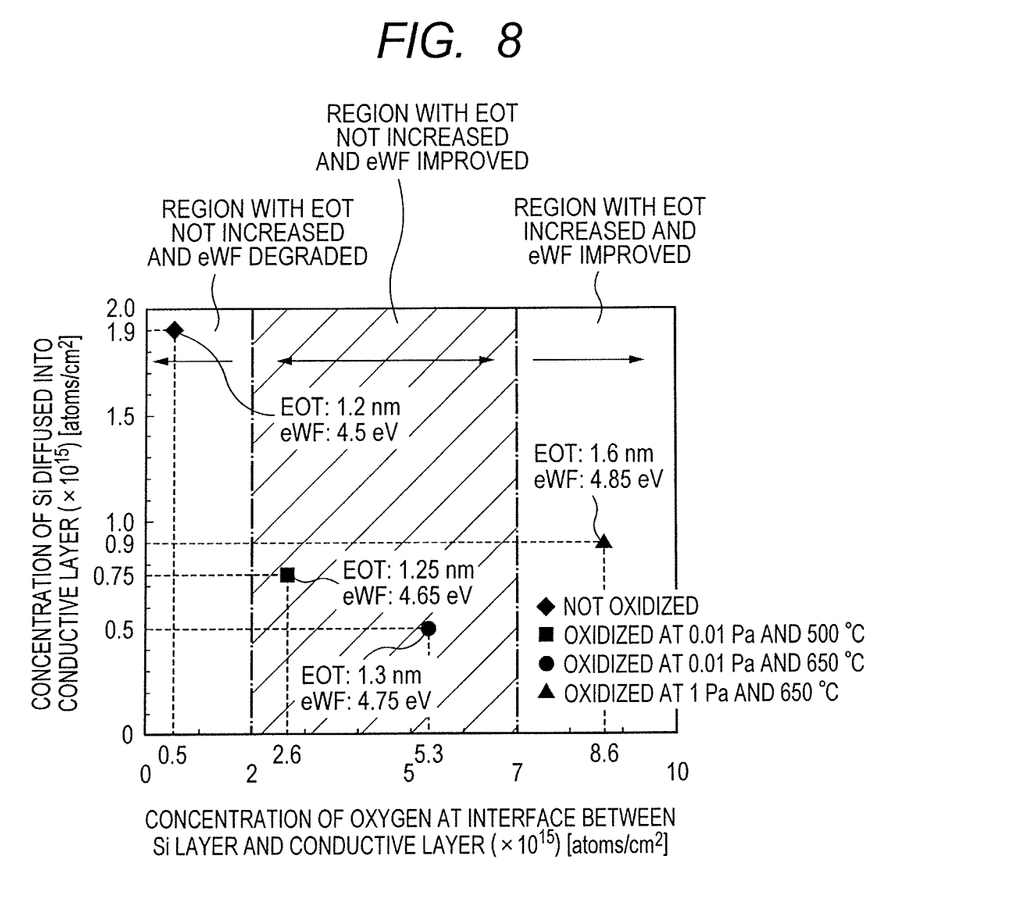
FIG. 8 is a diagram showing a relationship between the oxygen content of TiN film and an amount of Si diffused into the TiN film in devices manufactured by the manufacturing method of the first embodiment of the present invention.

FIG. 8 is a diagram showing a relationship between the oxygen content of the conductive layer 4 and the amount of Si diffused into the conductive layer 4 in devices manufactured by the manufacturing method according to the first embodiment. FIG. 8 also shows the characteristics of a device which was obtained without the step of forming the metal oxynitride region in the region where the titanium nitride layer and silicon layer were in contact. As shown in FIG. 8, diffusion of Si due to the heat treatment was reduced by performing the step of forming the metal oxynitride region. As shown in FIG. 8, it was found in the cases of symbols ■, ●, and ▲ according to the embodiment, by performing the heat treatment in the atmosphere with an oxygen partial pressure of 0.01 to 1 Pa, the effective work function eWF can be improved. Moreover, in the case of symbols ♦, as shown in FIG. 8, it was found that the effective work function eWF was not increased. In the light of the results of FIGS. 3 to 7, in order to reduce the increase in EOT while reducing the decrease in eWF, it is preferable that the oxygen content (oxygen concentration) at the interface between the silicon layer 5 and conductive layer 4 is $2\times10^{15}$ to $7\times10^{15}$ atoms/cm$^2$.

(Second Embodiment)

Figure 9:
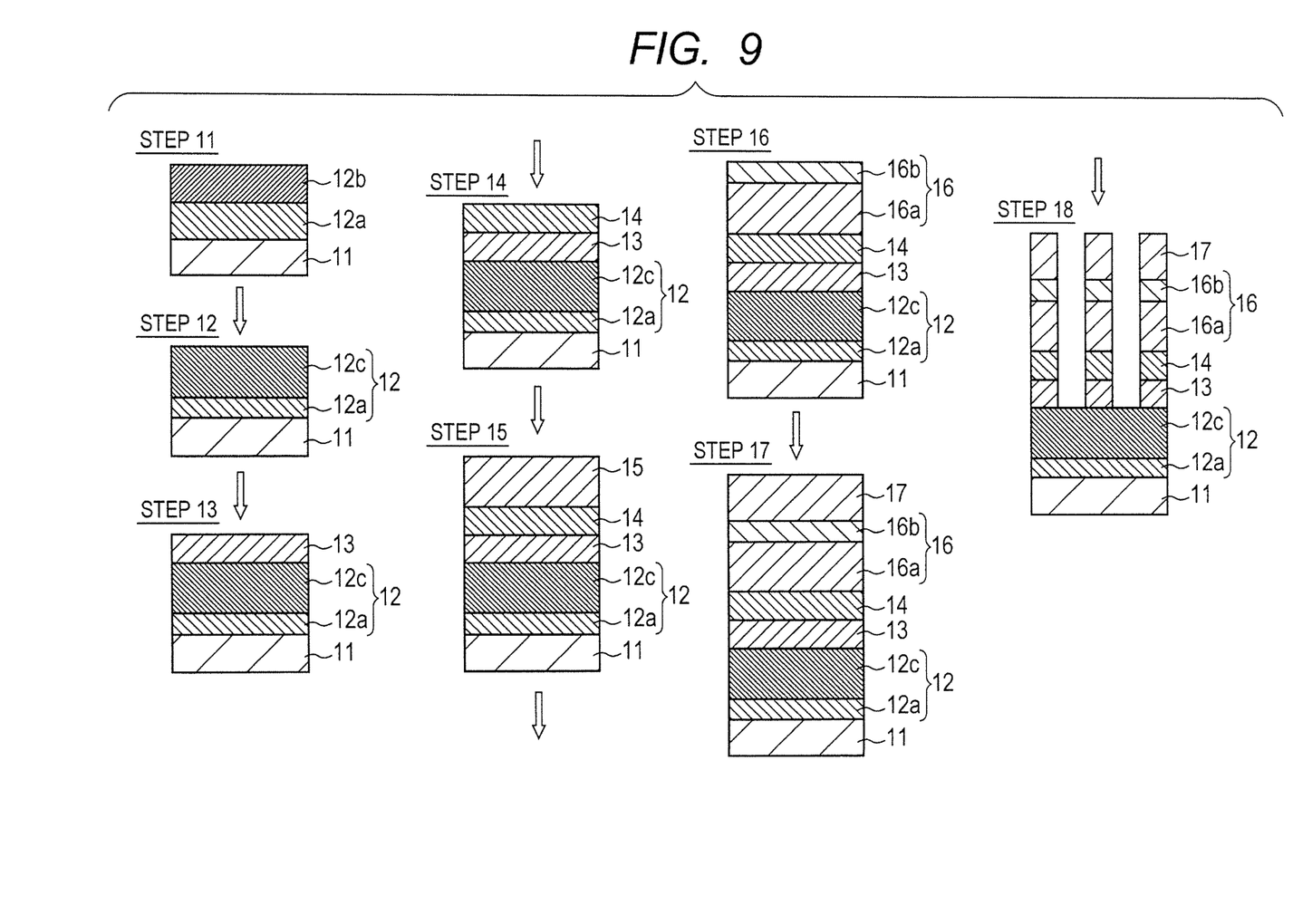
FIG. 9 is a view showing a manufacturing process of a semiconductor device of a second embodiment of the present invention.

In a second embodiment, a metal nitride layer containing Ti and N and a layer containing Al are provided between the gate insulating film and the conductive layer including the metal nitride region and metal oxynitride region in the structure of the first embodiment. Specifically, a semiconductor device according to the second embodiment includes: a silicon substrate; a gate insulating film formed on the silicon substrate; a metal nitride layer formed on the gate insulating film; a layer which is formed on the metal nitride layer and contains Al; a metal nitride region formed on the layer containing Al; a metal oxynitride region formed on the metal nitride region; and a silicon layer formed on the metal oxynitride region. The semiconductor device according to the second embodiment is manufactured according to the manufacturing method shown in FIG. 9. As shown in FIG. 9, on a p-type silicon substrate 11 provided with a gate insulating film 12 on the surface, the gate insulating film 12 including a silicon oxide film 12a and a HfSiO film 12c as a high dielectric constant film, a titanium nitride film 13 as a second metal nitride layer, an Al metal film 14 as the layer containing aluminum (Al), and a titanium nitride film 15 as the first metal nitride layer are formed in this order. Subsequently, the surface of the titanium nitride film 15 is oxidized to form a conductive layer 16 including a TiN region 16a as the metal nitride region and a TiON region 16b as the metal oxynitride region, on which a silicon layer 17 is then formed. The manufacturing process of this embodiment is described using FIG. 9. The silicon substrate 11 includes thin $SiO_2$ 12a (1.8 nm, for example) which is formed by deposition at first. In step 11 of FIG. 9, an apparatus having the same configuration as the processing apparatus 100 shown in FIG. 3 (using an Hf target herein) is used to deposit on the $SiO_2$ 12a, an Hf film 12b (0.5 nm, for example) for forming the high dielectric constant gate insulating film (HfSiO).

Next, in step 12 of FIG. 9, after the Hf film 12b is deposited as described above, the silicon substrate 11 is delivered into a not-shown thermal annealing module. In the thermal annealing module, the silicon substrate 11 with the $SiO_2$ 12a and Hf film 12b formed thereon is heated to a high temperature exceeding 400° C. in the oxygen gas atmosphere by SPIR. The Hf film 12b is therefore oxidized to form the high permittivity gate dielectric film 12 including the $SiO_2$ 12a and HfSiO 12c formed on the $SiO_2$ 12a. Preferably, the oxygen partial pressure of the oxygen gas atmosphere is 0.01 to 1 Pa. If the oxygen partial pressure is not more than 0.01 Pa, leakage current is degraded. If the oxygen partial pressure is not less than 1 Pa, the EOT is increased. The heating process can be performed by one step or plural steps. In order to control the chemical reaction during the annealing process, normally, it is proper to perform the heating process by two or more steps. For example, at first, the film is heated to 400° C. to oxidize the metal element in the Hf film. If the Hf film is heated at once to a very high temperature of 800° C., for example, the metal element in the film forms a silicon compound, which is stable and has metallic characteristics, in some cases. After the film is properly oxidized at a comparatively low temperature of 400° C., for example, the temperature is increased to a high temperature of 900° C., for example, preferably in an environment of inert gas. In the case where the starting material is a metal stack including different metals, high temperature annealing is important in diffusion between the materials and formation of uniform film.

Next, in step 13 of FIG. 9, the silicon substrate 11 with the high dielectric constant gate insulating film 12 formed thereon is fed into the processing apparatus 100 including a Ti target 106. In the step 13, argon gas is introduced into the processing apparatus 100 from an inert gas source 201, and nitrogen gas is introduced into the processing apparatus 100 from a nitrogen gas source 205. The partial pressure ratio of argon gas to nitrogen gas is controlled to form the first titanium nitride film (TiN) 13 on the fed high dielectric constant gate insulating film 12 by magnetron sputtering.

Next, in step 14 of FIG. 9, on the first titanium nitride film (TiN) 13, the Al film 14 is formed by magnetron sputtering in a vacuum vessel. The vacuum vessel used in the step 14 may be the processing apparatus or a film forming apparatus different from the processing apparatus 100. In the case of performing the step 14 within the processing apparatus 100, an Al target (not shown) needs to be further provided in the processing apparatus.

Next, in step S15 of FIG. 9, argon gas is introduced from the inert gas source 201 into the processing apparatus 100 while nitrogen gas is introduced from the nitrogen gas source 205 into the processing apparatus 100, and a second titanium nitride film (TiN) film 15 is formed on the Al film 14 by magnetron sputtering. Subsequently, steps 16 to 18 of FIG. 9 are performed in a similar way to the steps 4 to 6 of FIG. 2. Specifically, in the step 16 of FIG. 9, the surface of the second titanium nitride film (TiN) 15 is oxidized by introduction of oxygen gas and heat treatment (600 to 900° C., for example) performed for the second titanium nitride (TiN) film 15 to form the TiON region 16b. Next, in the step 17 of FIG. 9, in the vacuum vessel, the Si target is magnetron sputtered under the atmosphere of inert gas to form the silicon layer 17 on the TiON region 16b. Next, in the step 18 of FIG. 9, the thus obtained product is processed into the MOSFET (metal oxide semiconductor field transistor).

Figure 10:
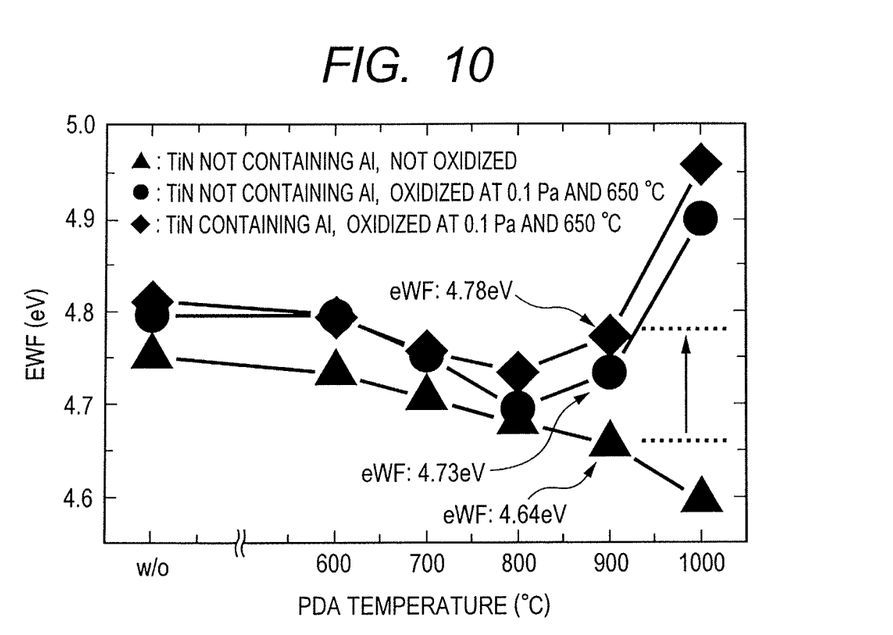
FIG. 10 is a diagram showing a relationship between eWF of devices manufactured by the manufacturing method of the second embodiment of the present invention and heat treatment temperature after the gate electrodes thereof are formed.

FIG. 10 is a diagram showing a relationship between eWF of devices manufactured by the manufacturing method of the second embodiment and the heat treatment temperature after formation of the gate electrode. FIG. 10 also shows as a comparative example, the characteristics of a device which was not subjected to the step of forming the metal oxynitride region in the region where the titanium nitride layer and silicon layer were in contact. As shown in FIG. 10, similar to the first embodiment, by performing the step of forming the metal oxynitride region in the region where the titanium nitride layer and silicon layer were in contact, the decrease in eWF due to the heat treatment can be reduced. In FIG. 10, symbols ▲ indicate, as the comparative example, the case where metal nitride (TiN, for example) was formed on a high permittivity gate dielectric film (HfSiO, for example) without the oxidation treatment characteristic of the present invention. Symbols ● indicate the case where the titanium nitride film (TiN) 3 was formed on the high permittivity gate dielectric film 2 (HfSiO, for example) with magnetron sputtering and the surface of the titanium nitride (TiN) film 3 was oxidized by supplying oxygen gas (0.1 Pa) to the titanium nitride (TiN) film 3 and performing heat treatment (650° C., for example) to form the TiON region 4b (the first embodiment). Symbols ♦ indicate the case where the first titanium nitride (TiN) film 13, Al metal film 14, and second titanium nitride film (TiN) 15 are formed on the high dielectric constant gate insulating film 12 (HfSiO, for example) with magnetron sputtering in this order and the surface of the second titanium nitride (TiN) film 15 was oxidized by supplying oxygen gas (0.1 Pa) and performing heat treatment (650° C., for example) to form the TiON region 16b (the second embodiment). In the cases of the symbols ● and ♦ according to the first and second embodiments, it was found that the effective work function eWF was not less than 4.75 eV regardless of the heat treatment temperature after formation of the gate electrode. By contrast, in the symbols ▲ of the comparative example, it was found that the effective work function eWF decreased as the heat treatment temperature after formation of the gate electrode increased and reached to 4.6 eV or less.

Figure 11:
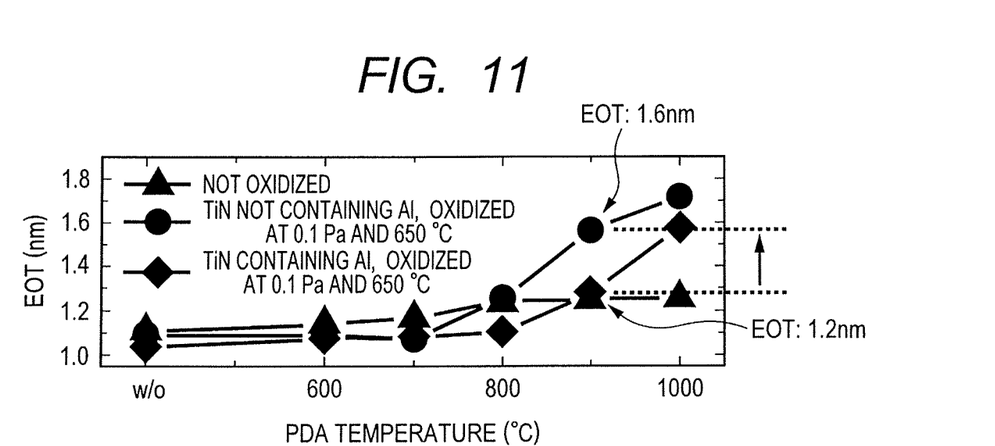
FIG. 11 is a diagram showing a relationship between EOT of devices manufactured by the manufacturing method of the second embodiment of the present invention and heat treatment temperature after the gate electrodes thereof are formed.

FIG. 11 is a diagram showing a relationship between the EOT of devices manufactured by the manufacturing method according to the second embodiment and the heat treatment temperature after formation of the gate electrode. FIG. 11 also shows, as a comparative example, the characteristics of a device obtained without the step of forming a metal oxynitride region in the region where the titanium nitride layer and silicon layer are in contact. As shown in FIG. 11, according to the first and second embodiments, the increase in EOT due to the heat treatment can be reduced even in the case of using the step of forming the metal oxynitride region in the region where the titanium nitride layer and silicon layer were in contact. In FIG. 11, symbols ▲ indicate a comparative example where metal nitride (TiN, for example) was formed on a high permittivity gate dielectric film (HfSiO, for example) without the oxidation treatment characteristic of the present invention. Symbols ● indicate the case where the titanium nitride film (TiN) 3 was formed on the high permittivity gate dielectric film 2 (HfSiO, for example) with magnetron sputtering and the surface of the titanium nitride (TiN) film 3 was oxidized by supplying oxygen gas (0.1 Pa) and performing heat treatment (650° C., for example) to form the TiON region 4b (the first embodiment). Symbols ♦ indicate the case where the first titanium nitride (TiN) film 13, Al metal film 14, and second titanium nitride film (TiN) 15 were formed on the high permittivity gate dielectric film 12 (HfSiO, for example) with magnetron sputtering in this order and the surface of the second titanium nitride (TiN) film 15 was oxidized by supplying oxygen gas (0.1 Pa) to the titanium nitride (TiN) film 3 and performing heat treatment (650° C., for example) to form the TiON region 16b (the second embodiment). In the cases of the symbols ♦ and ♦, it was found that the EOT did not change as the heat treatment temperature after formation of the gate electrode increased.

In the second embodiment, the first titanium nitride (TiN) film, Al metal film, and second titanium nitride film are formed on the gate insulating film in this order by magnetron sputtering, and the surface (exposed surface) of the second titanium nitride film is oxidized to form the metal oxynitride region on the side where the upper silicon layer is to be formed later. On the metal oxynitride region, the upper silicon layer is formed. Accordingly, the second embodiment can provide a similar effect to that of the first embodiment.

What is claimed is:

1. A semiconductor device, comprising a field effect transistor including:
   a gate dielectric insulating film provided on a silicon substrate; and
   a gate electrode provided on the gate dielectric insulating film, wherein
   the gate electrode is a stack-type gate electrode including: a conductive layer containing at least Ti, N, and O (oxygen); and a silicon layer provided on the conductive layer,
   the concentration of oxygen in the conductive layer is highest at a surface of the conductive layer in contact with the silicon layer and varies in a thickness direction of the conductive layer, and
   the concentration of oxygen at the surface in contact with the silicon layer is $2\times10^{15}$ to $7\times10^{15}$ atoms/cm$^2$.

2. The semiconductor device according to claim 1, wherein the silicon layer is a polycrystalline silicon layer.

3. The semiconductor device according to claim 1, further comprising:
   a metal nitride layer which is provided on the gate dielectric insulating film between the conductive layer and the gate dielectric insulating film and contains Ti and N; and
   a layer which is provided on the metal nitride layer between the conductive layer and the gate dielectric insulating film and contains Al.

4. The semiconductor device according to claim 1, wherein the field effect transistor is a p-type MOSFET.

* * * * *